US008115202B2

(12) United States Patent
Hsu et al.

(10) Patent No.: US 8,115,202 B2
(45) Date of Patent: Feb. 14, 2012

(54) THIN FILM TRANSISTOR ARRAY SUBSTRATE AND ELECTRONIC INK DISPLAY DEVICE

(75) Inventors: Yu-Chen Hsu, Hsinchu (TW); Chuan-Feng Liu, Hsinchu (TW); Chia-Hao Kuo, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 1436 days.

(21) Appl. No.: 11/651,663

(22) Filed: Jan. 10, 2007

(65) Prior Publication Data

US 2007/0234151 A1 Oct. 4, 2007

(30) Foreign Application Priority Data

Feb. 24, 2006 (TW) ............................... 95106252 A

(51) Int. Cl.
*H01L 23/50* (2006.01)
*H01L 29/10* (2006.01)

(52) U.S. Cl. ..................... 257/48; 257/72; 257/E21.521

(58) Field of Classification Search ............. 324/760.01, 324/760.02; 257/E21.522, E21.523, E21.525, 257/72

See application file for complete search history.

(56) References Cited

U.S. PATENT DOCUMENTS

| | | | | |
|---|---|---|---|---|
| 6,839,121 | B2 * | 1/2005 | Kim et al. | 349/152 |
| 2002/0036616 | A1 * | 3/2002 | Inoue | 345/107 |
| 2002/0075419 | A1 | 6/2002 | Kwon | |
| 2004/0017531 | A1 * | 1/2004 | Nagata et al. | 349/139 |
| 2005/0046439 | A1 * | 3/2005 | Yu | 324/770 |
| 2005/0073335 | A1 * | 4/2005 | Kim et al. | 324/770 |
| 2005/0189876 | A1 * | 9/2005 | Yamazaki et al. | 313/506 |
| 2006/0226866 | A1 * | 10/2006 | Ando | 324/770 |
| 2007/0018680 | A1 * | 1/2007 | Jeon et al. | 324/770 |
| 2007/0108445 | A1 * | 5/2007 | Lan et al. | 257/59 |
| 2007/0273956 | A1 * | 11/2007 | Kim et al. | 359/296 |

FOREIGN PATENT DOCUMENTS

| | | |
|---|---|---|
| CN | 1345026 | 4/2002 |
| CN | 1591028 A | 3/2005 |
| JP | 6043415 | 2/1994 |
| JP | 2005122209 A | 5/2005 |
| JP | 2005309075 A | 11/2005 |

* cited by examiner

*Primary Examiner* — Matthew Landau
*Assistant Examiner* — Latanya N Crawford
(74) *Attorney, Agent, or Firm* — CKC & Partners Co., Ltd.

(57) ABSTRACT

A thin film transistor array substrate suitable for being applied in an electronic ink display device is provided. The thin film transistor array substrate includes a substrate, scan lines, data lines, thin film transistors, pixel electrodes and testing signal lines. The data lines and the scan lines are disposed and define a plurality of pixel regions on the substrate. Each thin film transistor is disposed in the respective pixel region and driven by the corresponding scan line and data line. In addition, each pixel electrode is disposed in respective pixel region and electrically connected to the thin film transistor corresponding thereto. Furthermore, the testing signal line connects to the scan lines and/or the data lines in series. The testing accuracy as well as the production yield of the electronic ink display device and the thin film transistor array substrate can be improved by the design of the aforementioned testing circuit.

10 Claims, 6 Drawing Sheets

THIN FILM TRANSISTOR ARRAY SUBSTRATE AND ELECTRONIC INK DISPLAY DEVICE

RELATED APPLICATIONS

The present application is based on, and claims priority from, Taiwan Application Serial Number 95106252, filed Feb. 24, 2006, the disclosure of which is hereby incorporated by reference herein in its entirety.

BACKGROUND OF THE INVENTION

1. Field of Invention

The present invention relates to an active device array substrate and a display device. More particularly, the present invention relates to a thin film transistor array substrate and an E-ink display device.

2. Description of Related Art

E-ink display device was initially developed in 1970's. It is featured by a charged small ball with white color on one side and black color on the other side. The charged small ball rotates up and down to show different colors when the electrical field applied to small ball is changed. The second generation E-ink display device, developed in 1990's, is featured by a bi-stable charged particles which substitutes the conventional charged ball. The charged white particles may carry positive charge, negative charge or both. Nowadays, the major technical is using particles carrying positive/negative charge or using particles carrying single type charge/solution to display white/black colors.

In general, commercial E-ink display device comprises a front plane laminate (FPL) and a thin film transistor array substrate. Front plane laminate usually comprises a transparent cover, a transparent electrode layer and an E-ink material layer. The E-ink material layer comprises E-ink and supporting liquid. When the electrical field between each pixel electrode of the thin film transistor array substrate and the transparent cover of the front plane laminate is changed, E-ink will flow up or down to change optical property of each pixel.

After the thin film transistor array substrate and the FPL have been manufactured. It is always necessary to test the optical and electric property of wiring lines and pixels of the thin film transistor array substrate to ensure a good yield rate of E-ink display device. Before the driving circuit has been formed, a conventional shorting bar is used to test pixels. A gate shorting bar contacts to all scan lines and turn on all thin film transistors connected to all scan lines. A source shorting bar contacts to all data lines and a testing signal is input from the source shorting bar to data lines to input image data to every pixel so an image can be displayed and observed. The kind of test allows all thin film transistors and pixel electrodes to receive same signal. The existence of broken circuit leads thin film transistors and pixel electrodes to be unable to receive signal so an abnormal electric or optical behavior can be expected.

However, the above conventional test method is to input the same testing signal to all pixels so only the abnormal phenomenon of a specific displayed image can be observed, other pixel defects such as bright pint and dark point are not able to be observed. For example, two pixel electrodes of two neighboring pixels connected by residual indium tin oxide (ITO) is a type of defect which can not be detected by shorting bar because the testing signal for every pixel is the same no matter unanticipated residual ITO exists or not Furthermore, other problems when using a shorting bar to test a device might be expected. A shorting bar is generally longer than the length of the area pressed by and contacted to the shorting bar to ensure all signal lines are able to receive signal. However, because of growing development of small-sized portable products, electric circuit is always restricted in a very small area. It is necessary to shorten the length of shorting bar so it can be fitted to small-sized portable products without possible short circuit problem caused by long shorting bar. But some signal lines might not be able to receive signal when using such short shorting bar to test devices. Furthermore, the effects of pressing and contacting signal lines are varied by material, shape of shorting bar and pressure applied to signal lines. Signal with different intensity might be transmitted to different) signal line due to the non-uniform pressure applied by shorting bar to signal lines. The accuracy of a test result is thus decreased if such problem exists.

SUMMARY OF THE INVENTION

An aspect of the present invention is to provide a thin film transistor array substrate with testing circuit to improve both test accuracy and yield rate.

In accordance with the foregoing and another aspect of the present invention, an E-ink display device utilizing the thin film transistor substrate and testing circuit mentioned above is provided to improve test accuracy and yield rate.

In accordance with the foregoing and other aspects of the present invention, a thin film transistor array substrate is provided in an E-ink display device. The thin film transistor array substrate of the invention comprises a substrate, a plurality of scan lines and a plurality of data lines, a plurality of thin film transistors, a plurality of pixel electrodes, a plurality of testing signal lines, a plurality of testing switch devices and a testing control line. Scan lines and data lines are formed on the substrate. The substrate is divided into a plurality of pixel areas by the scan line and the data lines. Thin film transistors are formed on the pixel areas and activated by scan lines. Besides, pixel electrodes are formed in the pixel areas and connected to corresponding thin film transistors. Testing signal lines are serially connected scan lines and/or data lines and each of testing signal line is connected to, at least, one testing signal input port. Testing switch device is formed between the testing signal line and the scan line or between the signal line and the data line. The testing control line is connected to testing switch device to turn on or turn off the testing switch device. The testing control line is connected to, at least, one control signal input port.

In accordance with the foregoing and yet another aspect of the present invention, an E-ink display device is provided in this invention. The E-ink display device comprises a thin film transistor array substrate mentioned above, an E-ink material layer, a transparent cover and a transparent electrode. The E-ink material layer is formed on the pixel electrodes of the E-ink transistor array substrate and the transparent cover is formed on the E-ink material layer. Furthermore, the transparent electrode layer is formed between the transparent cover and the E-ink material layer.

In one of the preferred embodiments of the invention, the testing control line mentioned above may be connected to a negative voltage power signal input port to turn off the testing switch device.

In one of the preferred embodiments of the invention, the testing switch device is, for example, a transistor.

In one of the preferred embodiments of the invention, the scan lines and/or data lines are divided into a plurality of wiring groups. The testing signal lines are serially connected to the wiring groups. Any two scan lines or data lines in one wiring group are not formed next to each other.

In one of the preferred embodiments of the invention, the testing signal lines comprise a scan testing signal line and a data testing signal line. The scan testing signal line is serially connected to all scan lines and the data testing signal line is serially connected to all data lines.

In one of the preferred embodiments of the invention, the testing signal lines comprise a scan testing signal line and a plurality of data testing signal lines. The scan testing signal line is serially connected to all scan lines and the data testing signal lines are serially connected to all data lines. Any two data lines connected to one data testing signal line are not formed next to each other. For example, the testing signal lines comprise a scan testing signal line, a first data testing signal line and a second data testing signal line. The scan testing signal line is serially connected to all scan lines. The first data testing signal line is serially connected to No. 2N−1 data line and the second data testing signal line is serially connected to No. 2N data line, N is integer. In addition, the testing signal lines further comprise a scan testing signal line, a first data testing signal line, a second data testing signal line and a third testing signal line. The scan testing signal line is serially connected to all scan lines. The first data testing signal line is connected to No. 3N−2 data line, the second data testing signal line is connected to No. 3N−1 data line, the third data testing signal line is connected to No. 3N data line, N is integer.

In one of the preferred embodiments of the invention, the testing signal lines comprise a scan testing signal line and a plurality of data testing signal lines. The scan testing signal line is serially connected to all scan lines and the data testing signal lines are serially connected to all data lines. Any two data lines connected to one data testing signal line are not formed next to each other. For example, the testing signal lines comprise a scan testing signal line, a first data testing signal line and a second data testing signal line. The scan testing signal line is serially connected to all scan lines. The first data testing signal line is serially connected to No. 2N−1 data line and the second data testing signal line is serially connected to No. 2N data line, N is integer.

In one of the preferred embodiments of the invention, the material of the pixel electrode is, for example, transparent conducting material or metallic material.

Accordingly, a plurality of testing signal lines are used to test the optical and electric properties of the wiring lines and pixels on the thin film transistor array substrate. The test accuracy is higher than what conventional method is able to obtain. The scan lines and/or data lines can be divided into a plurality of wiring groups and serially connected to different testing signal lines. Different testing signals are input from different testing signal lines to the pixels in order to detect any possible pixel defect between two neighboring pixels. Therefore, the test accuracy as well as the production yield of the E-ink display device and the thin film transistor array substrate can be improved by the design of the aforementioned testing circuit. Production cost can thus be reduced.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
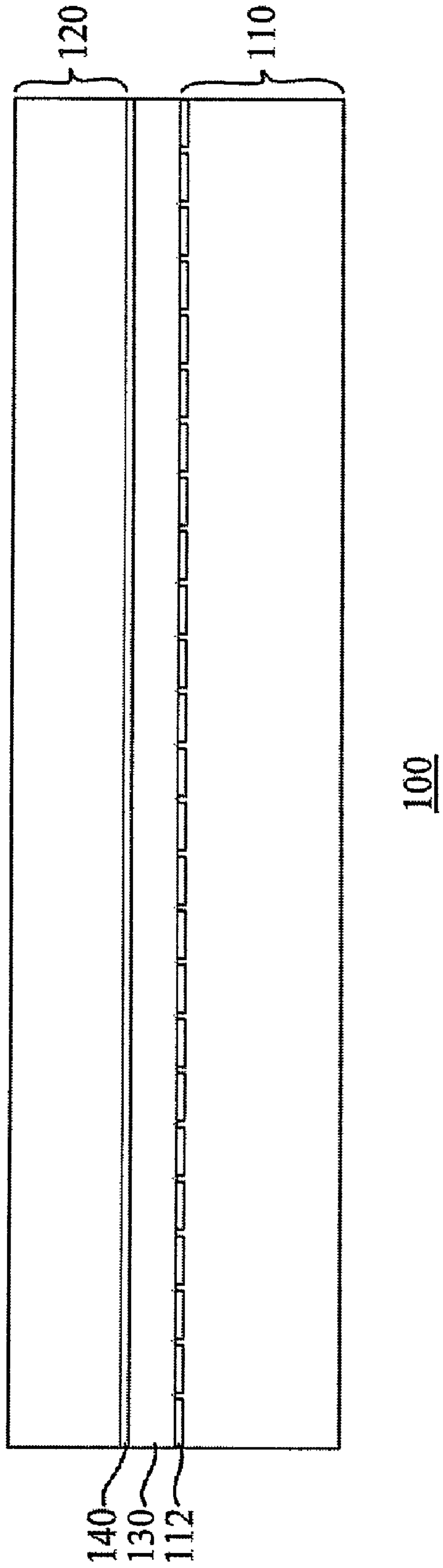
FIG. 1 is a cross-sectional view of an E-ink display device of this invention, according to one preferred embodiment of this invention.

Please refer to FIG. 1, FIG. 1 is a cross-sectional view of an E-ink display device of this invention, according to one preferred embodiment of this invention. E-ink display device 100 comprises a thin film transistor array substrate 110, a transparent cover 120, an E-ink material layer 130 and a transparent electrode layer 140. The transparent electrode layer 140 is made of indium zinc oxide (IZO) or other transparent conducting materials. The E-ink material layer 130 is formed between the transparent electrode layer 140 and the pixel electrode 112 of the thin film transistor array substrate 110. The optical property of each pixel in the E-ink display device 100 can be modified by changing the electric field between the pixel electrode 112 and the transparent electrode layer 140.

The wiring and pixel structure of the thin film transistor array substrate in this invention will be disclosed and several preferred embodiments will also be discussed.

Figure 2:
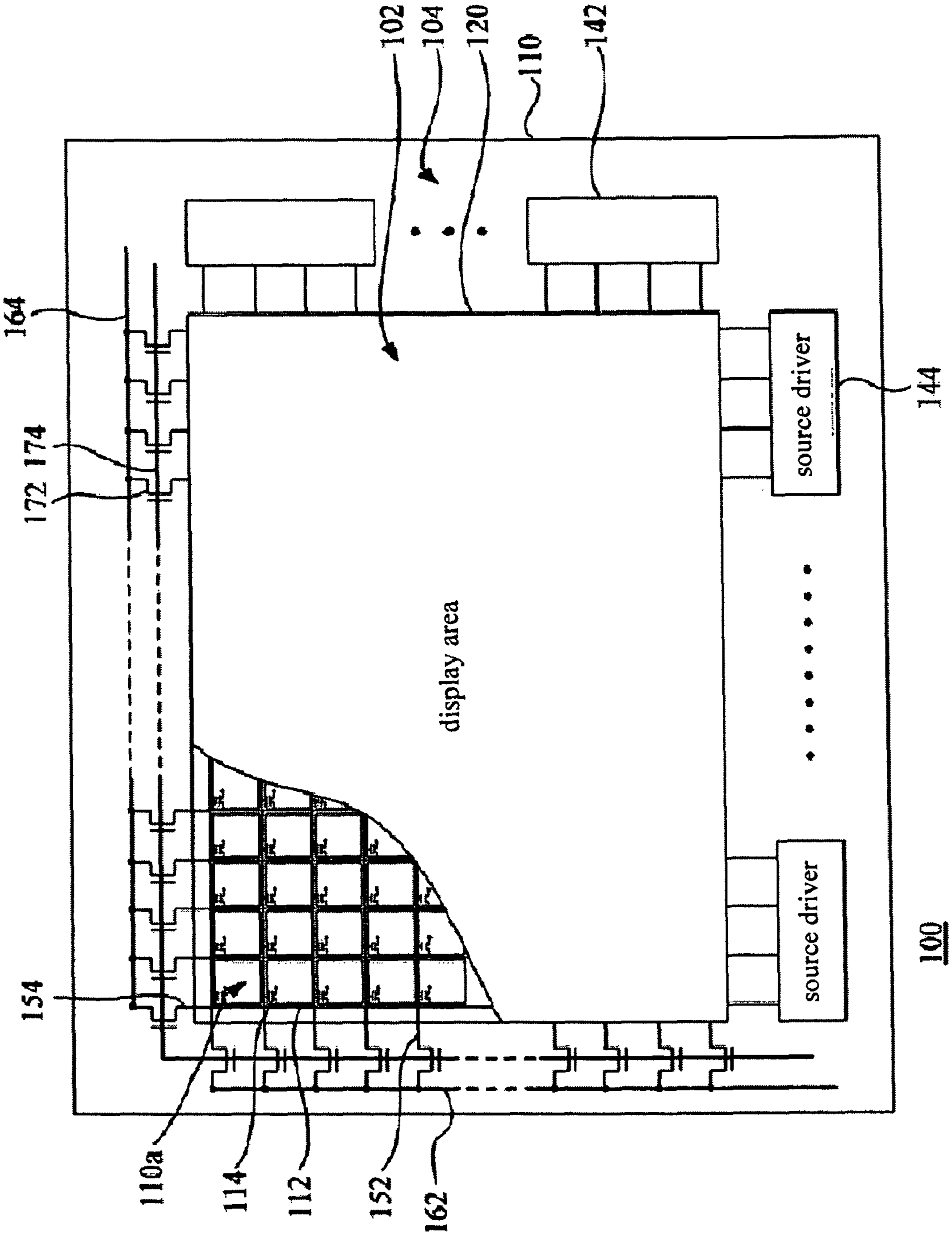
FIG. 2 is a top view of the E-ink display device in FIG. 1.

Please refer to FIG. 2, FIG. 2 is a top view of the E-ink display device in FIG. 1. The E-ink display device 100 comprises a display area 102 and a peripheral circuit area 104 surrounding the display area 102. Data lines 154 and scan lines 152 are formed on the substrate 111. The display area 102 is divided into a plurality of pixel areas 110*a*. Thin film transistors 114 and pixel electrodes 112 are formed in the pixel area 110*a*. The thin film transistors 114 are connected to corresponding scan lines 152 and data lines 154. The pixel electrodes 112 are connected to the thin film transistors 114. In this preferred embodiment, the material of pixel electrode is transparent conducting material or metallic material such as indium tin oxide, indium zinc oxide.

A plurality of gate drivers 142 and source drivers 144 are formed on the peripheral circuit device 104. The gate drivers 142 connected to scan lines 152 transmit driving signal from scan lines 152 to the gates of the thin film transistors 114 and turn on the thin film transistor 114 when displaying images. Source drivers 144 connected to data lines 154 are able to transmit image data to the pixel electrodes 112 when the thin film transistors 114 are turned on.

Please refer to FIG. 2, a scan testing signal line 162 and a data testing signal line 164 are serially connected to scan lines 152 and data lines 154, respectively. While doing the testing, a gate testing signal is transmitted to every scan line 152 via scan testing signal line 162 to turn on thin film transistors 114 connected to every scan line 152 and a testing signal is transmitted to data lines 154 via data testing signal line 164 to transfer image data to every pixel. The whole image displayed on the E-ink display device can thus be observed. The testing signal lines 162 and 164 in this preferred embodiment are used to do the test so all wiring lines are able to receive testing signal. The problem of incomplete test coverage or short circuit when doing the test resulted by small-sized portable devices can thus be avoided and the test accuracy can be increased.

Please refer to FIG. 2, in order to prevent the pixel from being interfered by testing signal lines 162, 164 or other testing circuits. The thin film transistor array substrate 110 further comprises a plurality of testing switch devices 172 and a testing control line 174. The testing switch device 172 is, for example, a transistor or any other switch device formed and connected between scan testing signal line 162 and scan line 152, and also between data testing signal line 164 and data line 154. The testing control line 174 is serially connected to the testing switch devices 172 to turn on and turn off the testing switch devices 172. When doing a test, the testing switch devices 172 can be turned on by the testing control line 174 so a testing signal can be transmitted to the scan lines 152 and the data lines 154 corresponded to the testing switch devices 172. In other conditions, the testing control line 174 is connected to a negative voltage power signal input port which provides power sufficient enough to turn off the testing switch devices 172, so the circuit between scan testing signal line 162 and scan line 152 and circuit between data testing signal line 164 and data line 154 can be broken to prevent the pixels from being interfered when doing a test.

What has to be noticed is both testing signal line and testing control line can be connected to, at least, one signal input port from where testing signal and control signal can be input.

Figure 3:
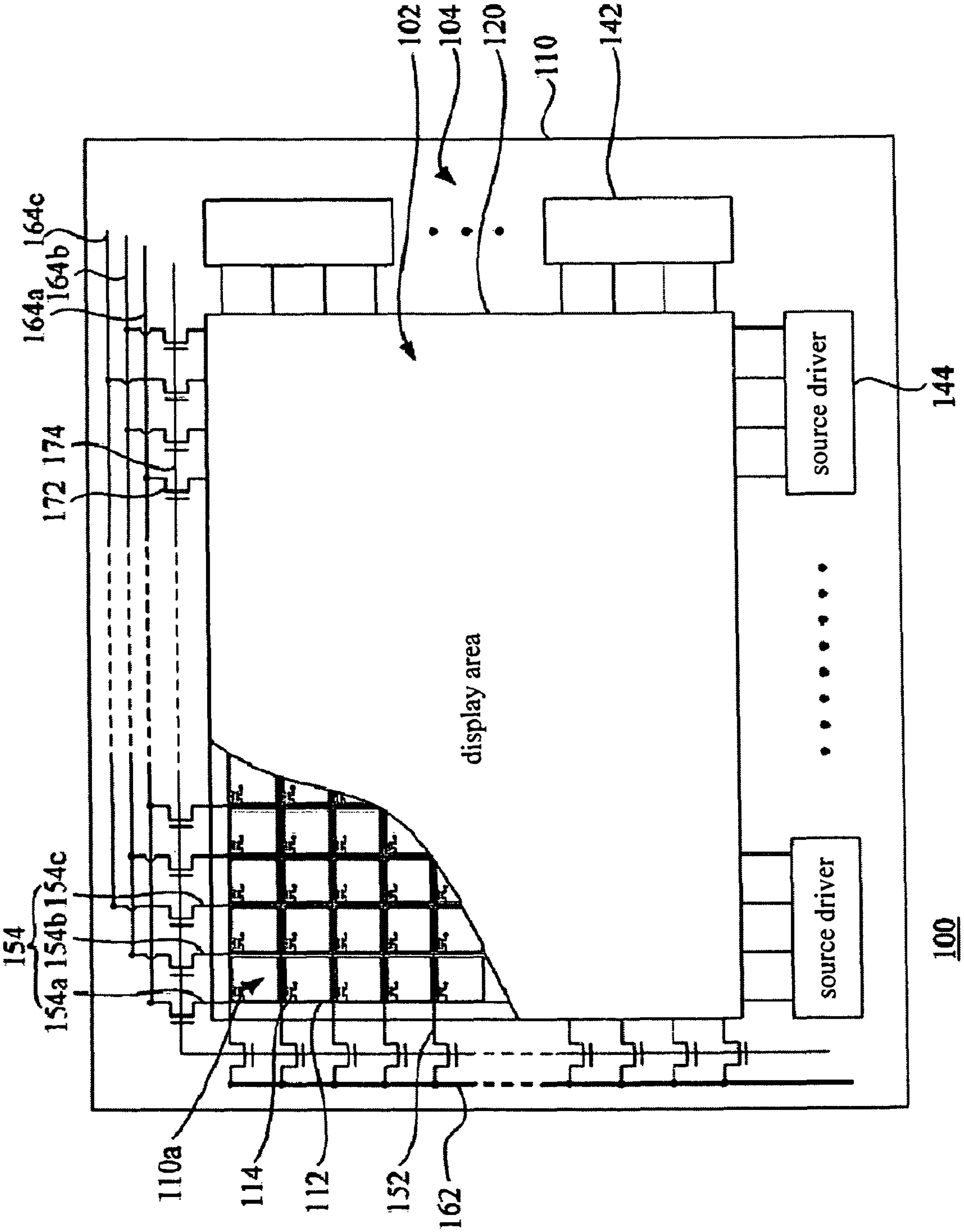
FIG. 3 is a top view of the E-ink display device, according to another preferred embodiment of this invention.

Please refer to FIG. 3, FIG. 3 is a top view of the E-ink display device, according to another preferred embodiment of this invention. Some devices identical to those mentioned above are numbered identically and will not be discussed again in this preferred embodiment. In order to detect possible defect between two neighboring pixel lines, scan lines and data lines can be divided into groups. For example, E-ink display device comprises red (R), green (G) and blue (B) pixels to obtain color effect. In this preferred embodiment, data line 154 comprises data line 154*a* for activating red pixel, data ling 154*b* for activating green pixel and data line 154*c* for activating blue pixel. Data testing signal lines 164*a*, 164*b* and 164*c* are formed on one side of the data line 154. A wiring group comprising data lines 154*a*, 154*b* and 154*c* are serially connected to data testing signal lines 164*a*, 164*b* and 164*c*, respectively.

Therefore, when testing the E-ink display device 100. Testing signal can be transmitted from the testing signal lines 164*a*, 164*b* and 164*c* to two neighboring pixel lines to detect possible pixel defect between the two pixel lines.

Figure 4:
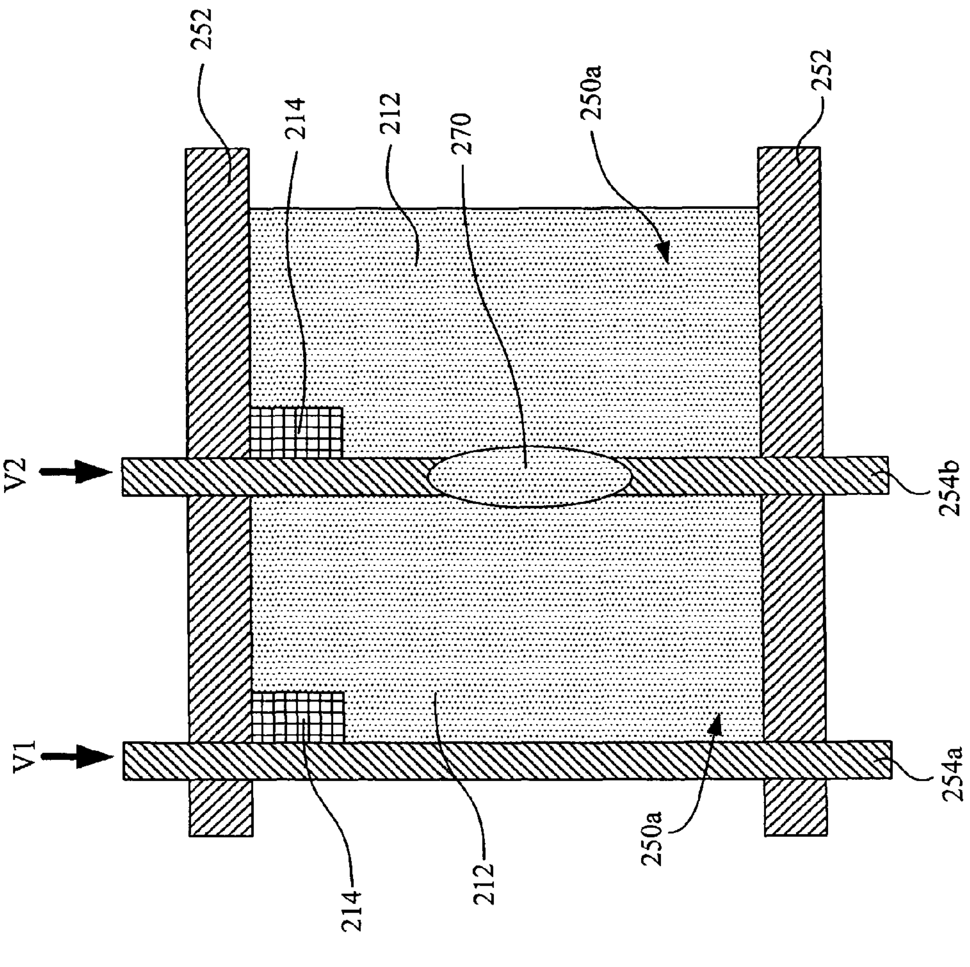
Fig. 4 (PRIOR ART)
FIG. 4 illustrates a possible defect in a conventional E-ink display device.

Please refer to FIG. 4 for more details, FIG. 4 illustrates a possible defect in a conventional E-ink display device. Pixel areas 250*a* are defined by scan lines 252 and data lines 254*a*, 254*b*. Thin film transistors 214 and pixel electrodes 212 are formed in the pixel area 250*a*. The pixel electrodes 212 are connected to the thin film transistors 214. Some residual conducting material 270 such as indium tin oxide may be left between two neighboring lines of pixels in manufacturing process so two neighboring pixel electrodes 212 are thus electrically connected together. However, this invention is to provide different data testing signal lines to connect to different groups of data lines. When testing the E-ink display device, different testing signals can be transmitted to data lines 254*a*, 254*b*. For example, different displaying voltage V1 and V2, V1>V2.

If white image is the normally white of a display device, then V1 allows, for example, the pixel corresponded to the pixel electrode 212*a* to display a bright point and the V2 allows, for example, the pixel corresponded to the pixel electrode 212*b* to display a dark point. However, the pixel electrode 212*a* and the pixel electrode 212*b* are connected together, so pixels corresponded to both pixel electrode 212*a* and pixel electrode 212*b* will display a bright point. Therefore, defect can thus be located.

The preferred embodiment mentioned above is to connect three different testing signal lines to pixels with different colors. However, it will be apparent to those skilled in the art that modifications can be made to the number of testing signal lines and the method of dividing data lines and scan lines into wiring groups. If any two scan lines or data lines in every wiring group are not formed next to each other, then the projective of this invention can be obtained. E-ink display device with different types of wiring groups will be illustrated. Only the method of dividing scan lines or data lines into groups and the way how to connect testing signal line will be discussed in follow preferred embodiments. The details of other devices on E-ink display device will be skipped and can be referred to previous preferred embodiments.

Figure 5:
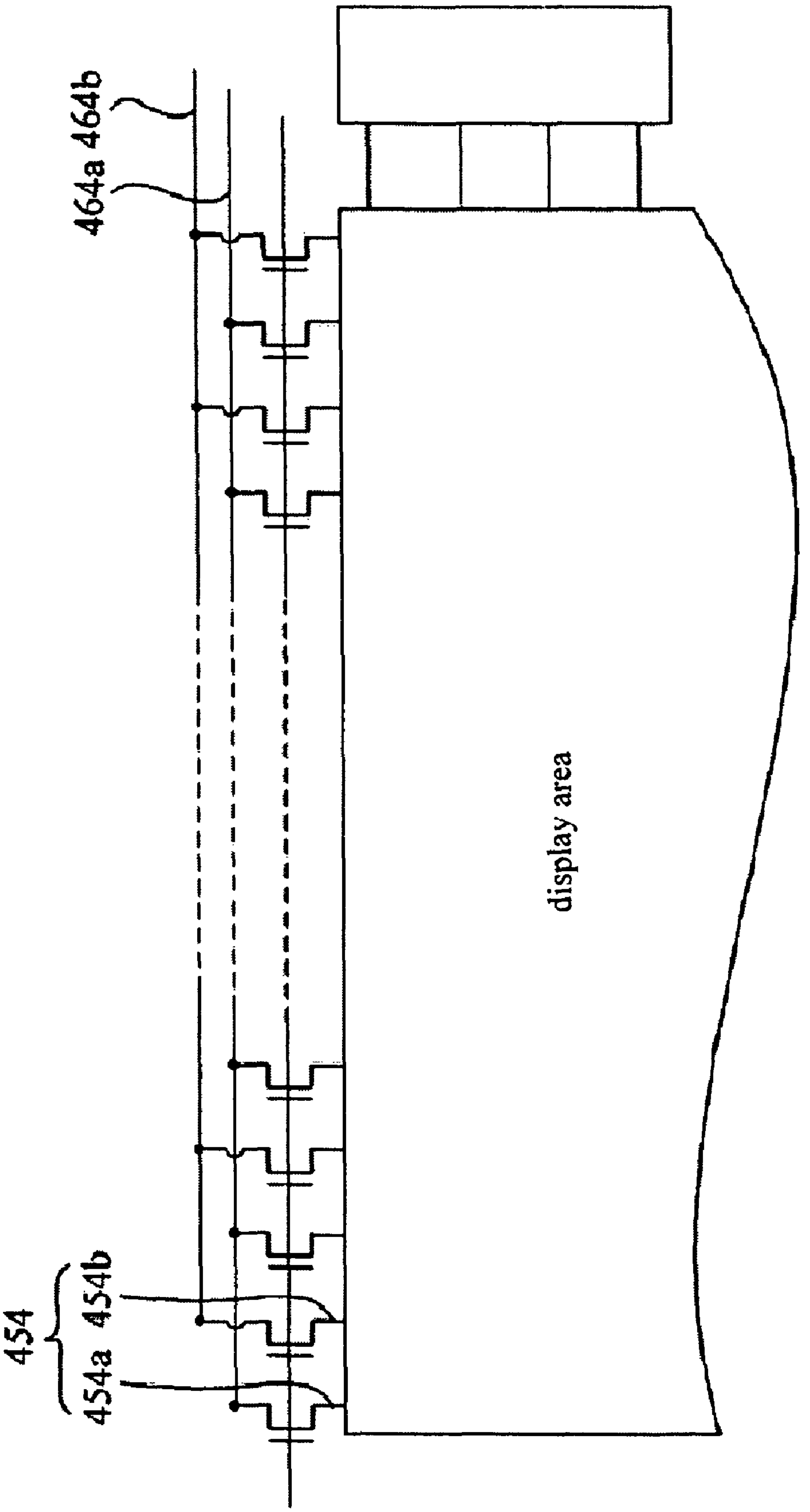
FIG. 5 is a top view of partial E-ink display device, according to another preferred embodiment of this invention.

FIG. 5 is a top view of partial E-ink display device, according to another preferred embodiment of this invention. As shown in FIG. 5, data lines 454 are divided into a first data line group 454*a* and a second data line group 454*b* which are alternatively formed. A first data testing signal line 464*a* is serially connected to a first data line group 454*a*. A second data testing signal line 464*b* is serially connected to a second data line group 454*b*.

Figure 6:
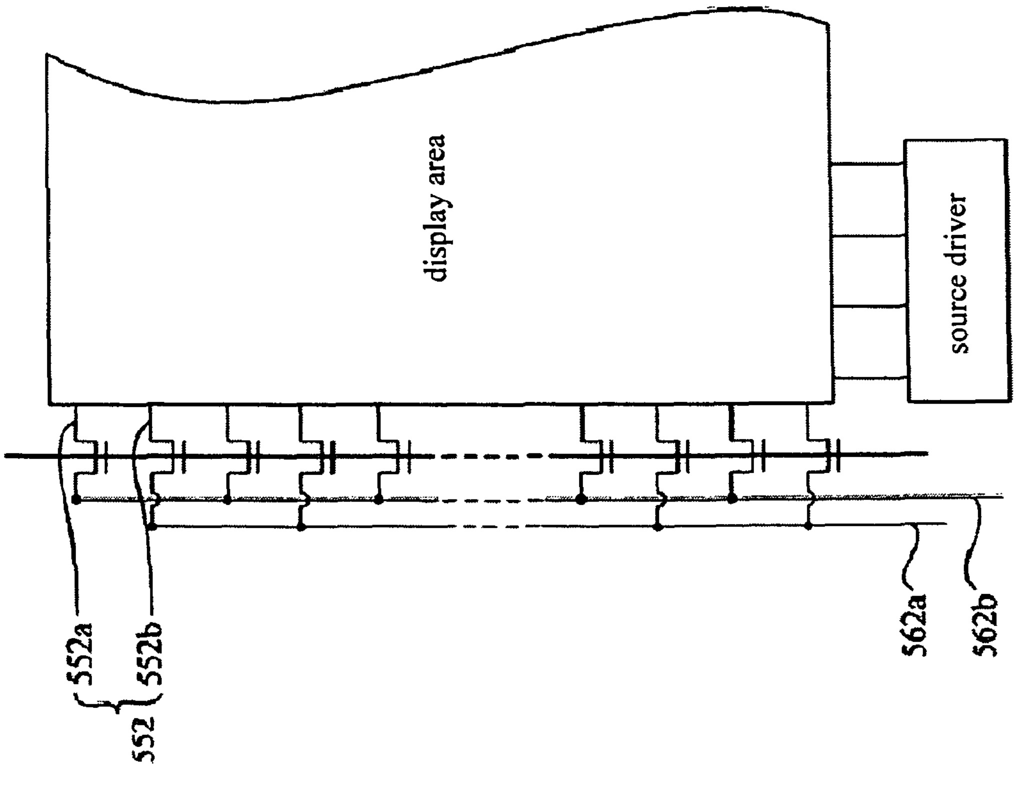
FIG. 6 is a top view of partial E-ink display device, according to yet another preferred embodiment of this invention.

In addition, FIG. 6 is a top view of partial E-ink display device, according to yet another preferred embodiment of this invention. As shown in FIG. 6, this preferred embodiment is, for example, to divide scan lines 552 into groups. Scan lines 552 are divided into a first scan line group 552*a* and a second scan line group 552*b* which are alternatively formed. A first scan testing signal line 562*a* is serially connected to a first scan line group 552*a*. A second scan testing signal line 562*b* is serially connected to a second scan line group 552*b*.

It is apparent that both scan lines and data lines can be selected together and divided into groups by ways mentioned in previous preferred embodiments to obtain better test accuracy. However, it is easy for those skilled in the arts to modify the wiring method based on this present invention. Other related modification will not be discussed again.

Accordingly, this invention is to increase the accuracy of pixel test result. A plurality of testing signal lines are divided into groups and serially connected to scan lines or data lines to improve test accuracy. Besides, scan lines and/or data lines can be divided into groups and serially connected to different testing signal lines in order to input different testing signals from different testing signal lines to two neighboring pixels. Therefore, possible defect between two neighboring pixel can be detected. The test accuracy as well as the production yield of the E-ink display device and the thin film transistor array substrate can be improved. Production cost can thus be reduced It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An E-ink display device, comprising:

a thin film transistor array substrate, comprising:

a substrate;

a plurality of scan lines formed on the substrate;

a plurality of data lines formed on the substrate, a plurality of pixel areas on the substrate are defined by the scan lines and the data lines;

a plurality of thin film transistors formed in the pixel areas and activated by the scan lines and the data lines;

a plurality of pixel electrodes formed in the pixel areas and connected to corresponding thin film transistors;

a plurality of testing signal lines serially connected to the scan lines and/or the data lines a plurality of testing switch devices formed between the testing signal lines and the scan lines or the data lines; and a testing control line serially connected to the testing switch devices to turn on or turn off the testing switch devices, wherein the testing signal lines comprises a scan testing signal line and a plurality of data testing signal lines, the scan testing signal line is serially connected to all scan lines and the data testing signal lines are serially connected to all data lines, any two data lines connected to one data testing signal line are not formed next to each other;

an E-ink material layer formed on the pixel electrodes of the thin film transistor array substrate;

a transparent cover formed on the E-ink material layer; and a transparent electrode layer formed between the transparent cover and the E-ink material layer.

2. The E-ink display device of claim 1, wherein the testing control lines are serially connected to a negative voltage power signal input port which is able to provide power to turn off switch devices.

3. The E-ink display device of claim 1, wherein the testing switch devices include transistor.

4. The E-ink display device of claim 1, wherein the scan lines and/or data lines are divided into a plurality of wiring groups, the testing signal lines are serially connected to the wiring groups, any two scan lines or data lines in one wiring group are not formed next to each other.

5. The E-ink display device of claim 1, wherein the pixel electrodes can be made of transparent conducting material or metallic material.

6. A thin film transistor array substrate used in an E-ink display device, comprising:

a substrate;

a plurality of scan lines formed on the substrate;

a plurality of data lines formed on the substrate, a plurality of pixel areas on the substrate are defined by the scan lines and the data lines;

a plurality of thin film transistors formed in the pixel areas and activated by the scan lines and the data lines;

a plurality of pixel electrodes formed in the pixel areas and connected to corresponding thin film transistors;

a plurality of testing signal lines serially connected to the scan lines and/or the data lines;

a plurality of testing switch devices formed between the testing signal lines and the scan lines or the data lines; and a testing control line serially connected to the testing switch devices to turn on or turn off the testing switch devices, wherein the testing signal lines comprise a scan testing signal line and a plurality of data testing signal lines, the scan testing signal line is serially connected to all scan lines and the data testing signal lines are serially connected to all data lines, any two data lines connected to one data testing signal line are not formed next to each other.

7. The thin film transistor array substrate of claim 6, wherein the testing control lines are serially connected to a negative voltage power signal input port which is able to provide power to turn off switch devices.

8. The thin film transistor array substrate of claim 6, wherein the testing switch devices include transistor.

9. The thin film transistor array substrate of claim 6, wherein the scan lines and/or data lines are divided into a plurality of wiring groups, the testing signal lines are serially connected to the wiring groups, any two scan lines or data lines connected to one wiring group are not formed next to each other.

10. The thin film transistor array substrate of claim 6, wherein the pixel electrodes can be made of transparent conducting material or metallic material.

* * * * *